United States Patent [19]

Jong

[11] Patent Number: 5,001,298

[45] Date of Patent: Mar. 19, 1991

[54] RADIO FREQUENCY INTERFERENCE DEVICE FOR A HIGH-FREQUENCY SIGNAL DISTRIBUTOR

[75] Inventor: Ruey Hwang Jong, Taipei, Taiwan

[73] Assignee: Signal CATV System Inc., Lung City, Taiwan

[21] Appl. No.: 423,269

[22] Filed: Oct. 18, 1989

[51] Int. Cl.$^5$ ............................................. H05K 19/00
[52] U.S. Cl. ...................................... 174/35 R; 174/50
[58] Field of Search ............... 174/50, 35 R; 361/424; 220/306

[56] References Cited

U.S. PATENT DOCUMENTS 4,567,318  1/1986  Shu .................................. 174/35 GC

FOREIGN PATENT DOCUMENTS 2243263  9/1972  Fed. Rep. of Germany .

Primary Examiner—Leo P. Picard
Assistant Examiner—Bot L. Ledynh
Attorney, Agent, or Firm—Merchant, Gould, Smith, Edell, Welter & Schmidt

[57] ABSTRACT

An improved radio-wave insulating device for a high frequency signal distributor, comprising a cover 2a and a case body 3a. The case body 3a is provided with a plurality of protuberances 32a which slightly outsizes the corresponding notches 22a of the cover 2a. Thus when the cover 2a is mounted in place in the case body 3a, a force, which results from the deformation of the protuberances 32a in the notches 22a, is provided parallel to the corresponding side of the cover, thus ensuring a firm engagement between the cover and the case body, without causing the bulging-out of the case body.

1 Claim, 4 Drawing Sheets

RADIO FREQUENCY INTERFERENCE DEVICE FOR A HIGH-FREQUENCY SIGNAL DISTRIBUTOR

The present invention relates to a radio frequency interference device for a high-frequency signal distributor.

To prevent the leakage of radiation, the insulating device is a metallic case which imperviously encloses a high-frequency signal distributor. In order to enable a worker to install the high-frequency signal distributor in the case, the case is divided into two separate parts, namely a cover and a case body. Since the joint between the cover and the case body is the only possible exit for the high-frequency signals to escape to the outside, the insulating efficiency depends largely on the impervious engagement of the joint between the cover and the case body.

Referring to FIG. 3, a conventional radio-wave insulating device comprises a cover 2 and a case body 3 made of aluminum. In order to ensure a tight engagement between the cover 2 and the case body 3, the thickness of the walls of the case body 3 becomes thinner near its brim, thus defining a surrounding ledge 31, and a plurality of triangular teeth 32 are provided. The width (W) and the length (L) of the inner space of the case body at the level of the ledge are respectively slightly smaller than the width (W') and the length (L') of the cover 3. Thus when the cover 2 is forced into engagement with the case body 3, the tip of each teeth is slightly deformed, and a compressive force is produced by the deformed teeth and urges toward the side of the cover 3 adjacent to each tooth (shown by arrows), thus fastening the cover 2 tightly in place.

This conventional insulating device suffers two disadvantages. Firstly, the case body 3 may bulge outward under the action of the teeth which are applied perpendicular to its four sides, thus causing some leakages between the cover 2 and the case body 3 and deteriorating the insulating efficiency of this device. Secondly, once the case body 3 is removed from the cover 2 [for example, to repair or to replace the high-frequency signal distributor therein ], it can no longer be used, since the tips of the teeth has become obtuse and can no longer apply a force to the cover 2 to tightly hold the latter when reused.

Accordingly its is the main object of this invention to provide an improved insulating device to obviate the aforesaid disadvantages.

Accodring to the present invention, the ledge is provided with a plurality of protuberances, and the cover is provided with a plurality of corresponding notches. Each protuberance must slightly outsize it corresponding notch so that a fastening force is produced due to the deformation of the protuberance in the notch. Since the force is parallel and not perpendicular to the side of the cover, the cover does not bulge out, thus ensuring a good insulation.

This invention will be better understood when read in connection with the accompanying drawing, in which:

DETAILED DESCRIPTION OF PREFERRED EMBODIMENT

Figure 1:
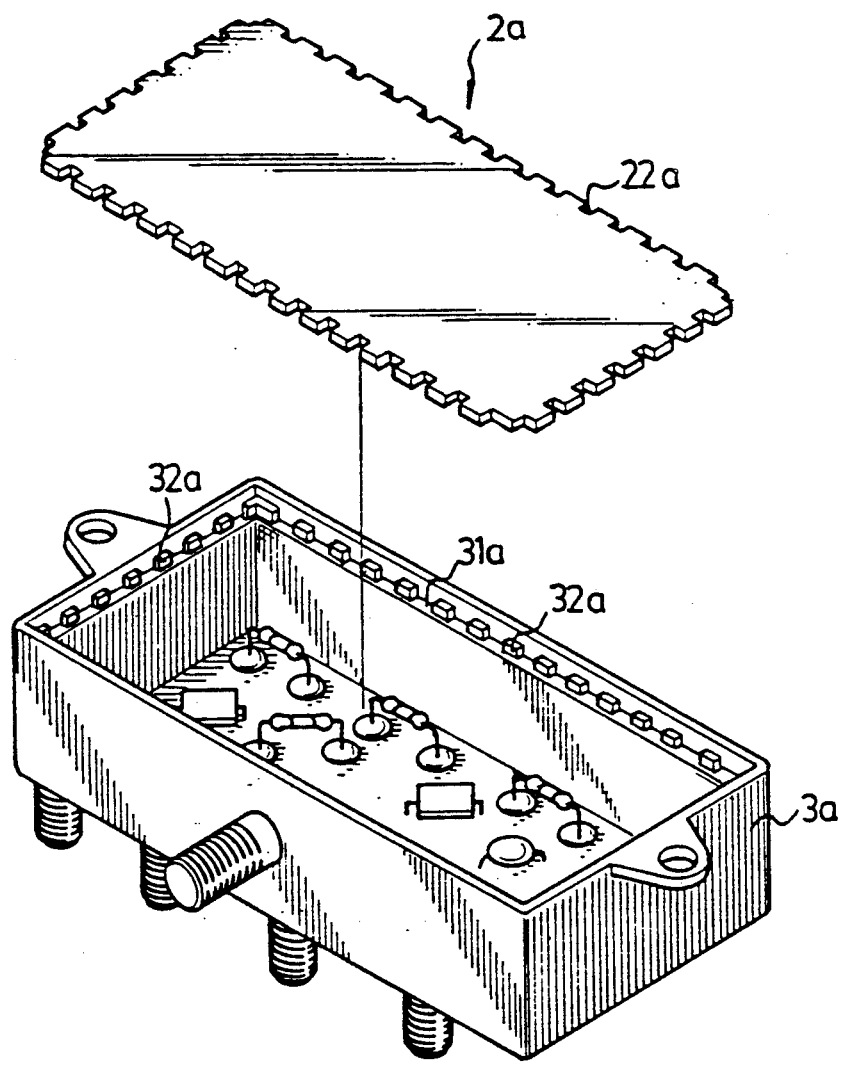
FIG. 1 is an exploded view of a radio wave insulating device according to this invention.
Figure 2:
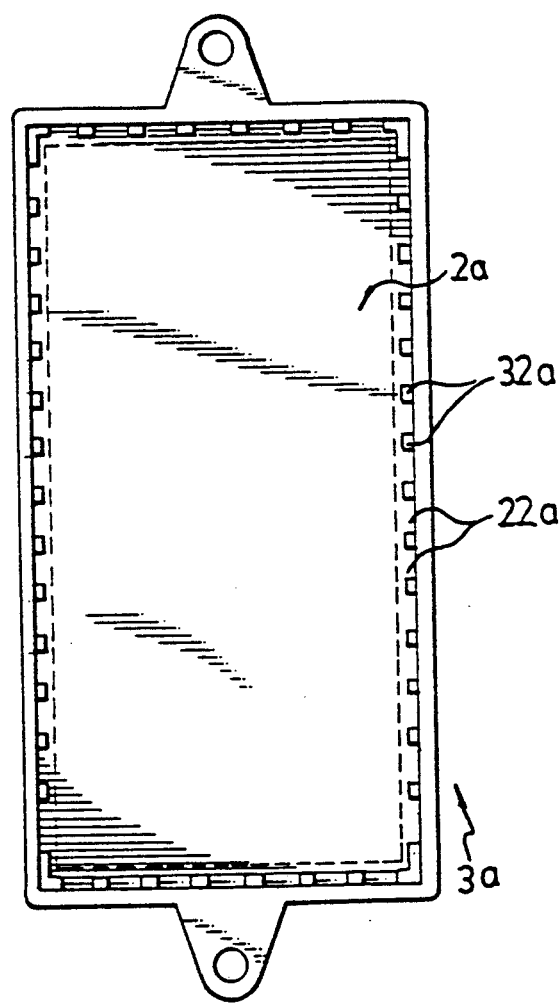
FIG. 2 is a plan view of the device of FIG. 1, showing the force due to the deformation of the protuberances in the notches.
Figure 3:
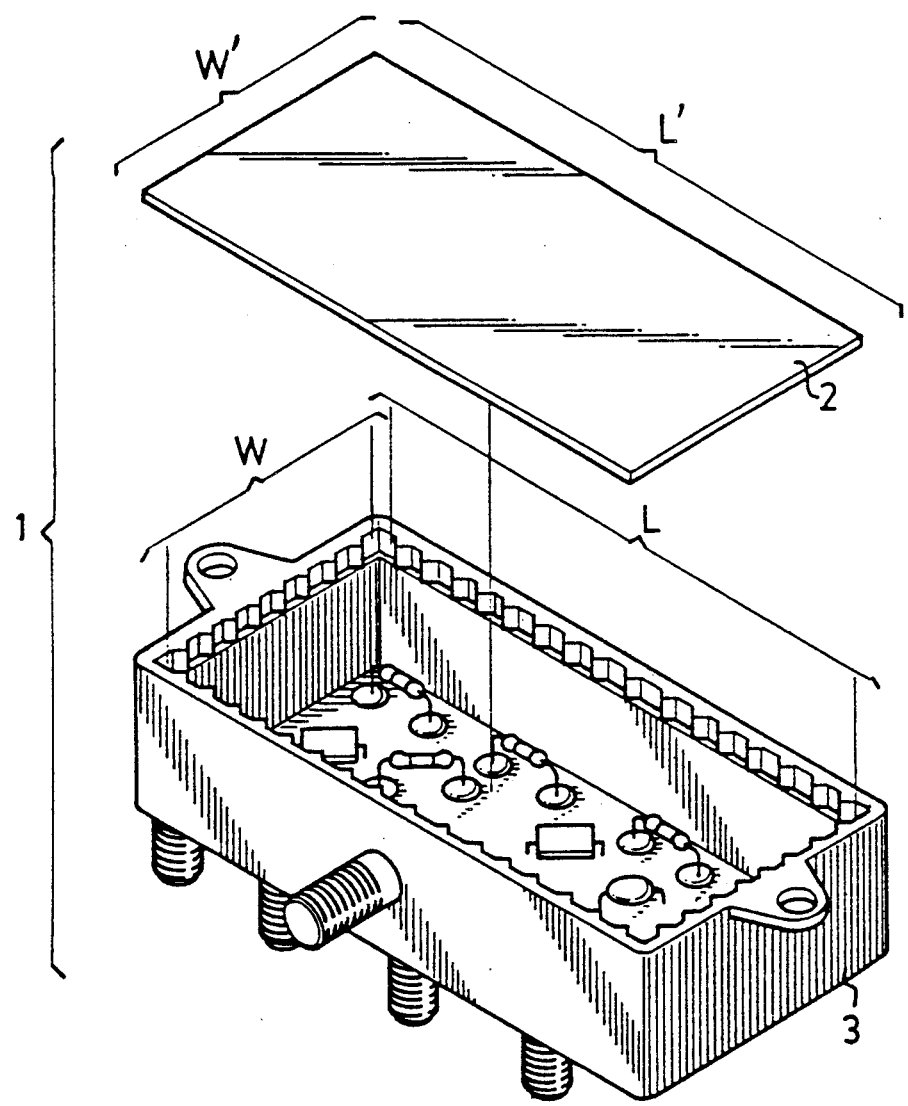
FIG. 3 is an exploded view of a conventional insulating device.

Referring to FIG. 1, an insulating device 1a according to this invention comprises a cover 2a and a case body 3a. The thickness of the side walls of the case body 3a becomes thinner near its brim, thus defining a ledge 31a. These are all the same as the prior art in FIG. 3. As stated before, the characteristic feature of this invention consists in that a plurality of protuberances 32a are provided on the ledge 31a, and a plurality of corresponding notches 22a are provided at the four sides of the cover 2a. The dimension of the cover 2a, the case body 3a, the notches 22c and the protuberances 32a must be such that when the cover 2a is received in place in the case body 3a, no force perpendicular to the sides, but the forces parallel to the sides of the cover 2a is produced. A protuberance 32a must slightly outsize its corresponding notch 22a so that it can be slightly deformed in the notch 22a.

Figure 4:
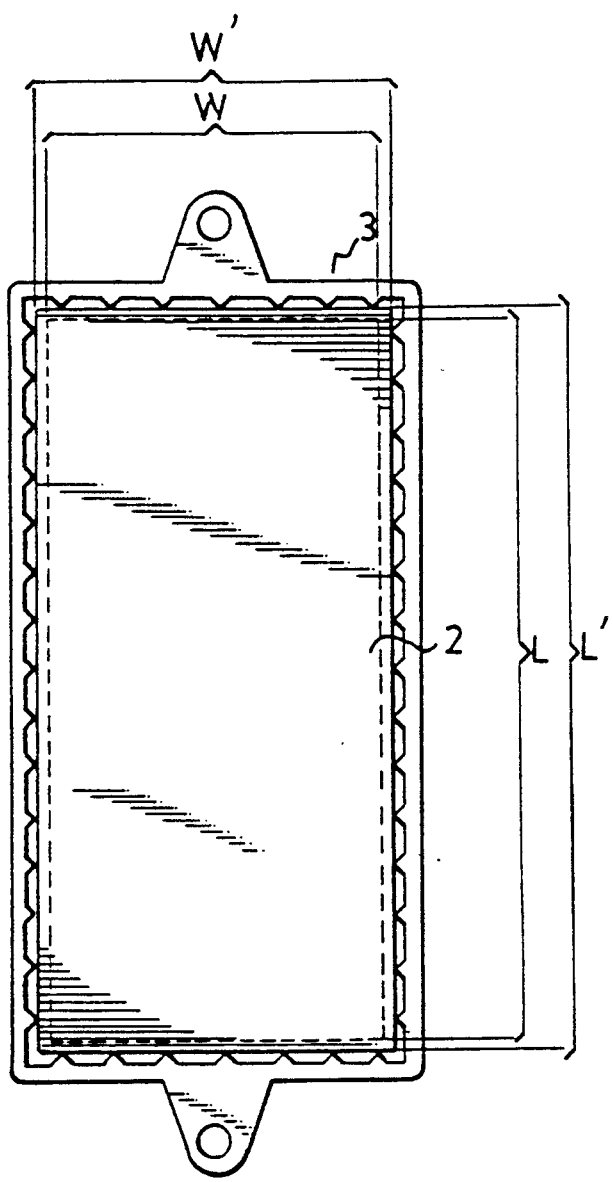
FIG. 4 is a plan view of the conventional insulating device in FIG. 3, showing the force due to the deformation of the teeth.

Referring to FIG. 4, the arrows indicate the forces resulting from the deformation of the protuberances 32a in their corresponding notches. Since the forces are all parallel to the sides of the cover 2a, they only reinforce the engagement of the cover 2a and the case body 3a, and do not cause the case body 3a to bulge out.

Preferably the protuberances 32a do not extend to the margin of the ledge to ensure a better insulation.

I claim:

1. A radio-wave insulator for a high-frequency signal distributor in the form of a metallic case comprising a cover and a case body, the thickness of side walls of said case body becomes smaller near a brim thereof, thus defining a ledge, on which a plurality of protuberances are formed, characterized by that each side of said cover having a plurality of notches corresponding and substantially complementary to said protuberances, said protuberances each slightly outsizing said corresponding notches when said cover is mounted in place in said case body, and each of said protuberances is slightly deformed in said corresponding notch, thus producing a force which acts in the direction parallel to the side of said cover where said notch is located, and the inward extension of each of said protuberances not reaching the margin of said ledge on which one said protuberances is situated.

* * * * *